United States Patent
Lee

(10) Patent No.: US 11,658,060 B2
(45) Date of Patent: May 23, 2023

(54) SIC MATERIAL AND METHOD FOR MANUFACTURING SAME

(71) Applicant: TOKAI CARBON KOREA CO., LTD, Gyeonggi-do (KR)

(72) Inventor: Sang Chul Lee, Gyeonggi-do (KR)

(73) Assignee: TOKAI CARBON KOREA CO., LTD, Gyeonggi-Do (KR)

(*) Notice: Subject to any disclaimer, the term of this patent is extended or adjusted under 35 U.S.C. 154(b) by 0 days.

(21) Appl. No.: 17/604,533

(22) PCT Filed: Mar. 25, 2020

(86) PCT No.: PCT/KR2020/004075
§ 371 (c)(1),
(2) Date: Oct. 18, 2021

(87) PCT Pub. No.: WO2020/213847
PCT Pub. Date: Oct. 22, 2020

(65) Prior Publication Data
US 2022/0148907 A1 May 12, 2022

(30) Foreign Application Priority Data

Apr. 18, 2019 (KR) .......................... 10-2019-0045602

(51) Int. Cl.
*C23C 16/32* (2006.01)
*H01L 21/687* (2006.01)
(Continued)

(52) U.S. Cl.
CPC .... *H01L 21/68757* (2013.01); *B01J 20/3202* (2013.01); *B82B 3/0033* (2013.01);
(Continued)

(58) Field of Classification Search
None
See application file for complete search history.

(56) References Cited

U.S. PATENT DOCUMENTS 5,879,450 A * 3/1999 Lee .......................... C30B 29/36
 118/724
5,993,370 A 11/1999 Brown et al.
(Continued)

FOREIGN PATENT DOCUMENTS

CN 103270203 A 8/2013
CN 106835071 A 6/2017
(Continued)

OTHER PUBLICATIONS

Cheng, Hong, et al. "Transparent highly oriented 3C-SiC bulks by halide laser CVD." Journal of the European Ceramic Society 38.9 (2018): 3057-3063. (Year: 2018).*

(Continued)

*Primary Examiner* — Robert S Loewe
(74) *Attorney, Agent, or Firm* — Armstrong Teasdale LLP

(57) ABSTRACT

Described herein are an SiC material and a method for manufacturing same. The SiC material includes an SiC layer having a low thermal conductivity region formed in at least a portion thereof, wherein the low thermal conductivity region has an average crystal grain size of 3.5 μm or less and (111) plane preferential growth according to X-ray diffraction analysis.

13 Claims, 5 Drawing Sheets

(51) Int. Cl.
B01J 20/32 (2006.01)
B82B 3/00 (2006.01)
H01J 37/32 (2006.01)
C23C 16/44 (2006.01)
H01L 21/02 (2006.01)
C30B 23/06 (2006.01)
C30B 29/36 (2006.01)
H01L 21/324 (2006.01)

(52) U.S. Cl.
CPC ............ C23C 16/325 (2013.01); C23C 16/44 (2013.01); C30B 23/06 (2013.01); C30B 29/36 (2013.01); H01J 37/32724 (2013.01); H01L 21/02167 (2013.01); H01L 21/02529 (2013.01); H01L 21/324 (2013.01)

(56) References Cited

U.S. PATENT DOCUMENTS

| | | | |
|---|---|---|---|
| 5,993,770 | A | 11/1999 | Kuroyanagi |
| 6,562,183 | B1 | 5/2003 | Yamada et al. |
| 9,725,822 | B2 | 8/2017 | Torimi et al. |
| 2013/0061800 | A1* | 3/2013 | Nakamura .......... C04B 41/5057 427/372.2 |
| 2013/0269596 | A1* | 10/2013 | Torimi .................... C30B 29/36 117/63 |
| 2018/0201545 | A1* | 7/2018 | Nagatomo ............ C04B 35/645 |
| 2018/0374672 | A1* | 12/2018 | Hayashi .................. H01J 37/20 |
| 2019/0177172 | A1 | 6/2019 | Kim |
| 2022/0148907 | A1* | 5/2022 | Lee ................... H01J 37/32724 |

FOREIGN PATENT DOCUMENTS

| | | |
|---|---|---|
| EP | 0899358 A2 | 3/1999 |
| EP | 3627572 A1 | 3/2020 |
| JP | 11-079846 A | 3/1999 |
| JP | 2000-355779 A | 12/2000 |
| JP | 2002003285 A | 1/2002 |
| JP | 2016204735 A | 12/2016 |
| KR | 10-1866869 B1 | 6/2018 |
| TW | 201903220 A | 1/2019 |
| WO | WO-2009021199 A1 * | 2/2009 ............. C23C 16/00 |
| WO | WO-2018117556 A1 * | 6/2018 ............. C23C 16/01 |

OTHER PUBLICATIONS

Collins et al. "Grain size dependence of the thermal conductivity of polycrystalline chemical vapor deposited β-SiC at low temperatures." Journal of applied physics 68.12 (1990): 6510-6512. (Year: 1990).*
Wu, Chien-Hung, et al. "Epitaxial growth of 3C-SiC on Si (111) from hexamethyldisilane." Journal of crystal growth 158.4 (1996): 480-490. (Year: 1996).*
Lee et al. "Influence of grain size on thermal conductivity of SiC ceramics." IOP Conference Series: Materials Science and Engineering. vol. 18. No. 16. IOP Publishing, 2011. (Year: 2011).*
Latha et al. "Growth and effect of deposition pressure on microstructure and electrical properties of 3C-SiC thin films deposited using methyltrichlorosilane single precursor." International Journal of Thin Films Science and Technology, vol. 2, No. 3, p. 163-170, Sep. 1, 2013.
Beaber et al. "Nanostructured SiC by chemical vapor deposition and nanoparticle impaction." Surface Coatings and Technology, vol. 202, p. 871-875, May 24, 2007.
English translation of International Search Report for International Patent Application No. PCT/KR2020/004075, dated Jul. 2, 33020, 2 pages.
Pai, "Thermoelectric Properties of the Reaction Sintered n-type β-SiC", Journal of the Korea Academia-Industrial Cooperation Society, vol. 20, No. 3, pp. 29-24,2019. Cited in International Search Report for corresponding International Patent Application No. PCT/KR2020/004075; only English Abstract available.

* cited by examiner

SIC MATERIAL AND METHOD FOR MANUFACTURING SAME

CROSS-REFERENCE TO RELATED APPLICATIONS

This application is a National Phase Application of PCT International Application No. PCT/KR2020/004075, having an International Filing Date of Mar. 25, 2020, which claims priority to Korean Patent Application No. 10-2019-0045602, filed Apr. 18, 2019, each of which is hereby incorporated by reference herein in its entirety.

TECHNICAL FIELD

The present invention relates to a SiC material and a method for manufacturing the same.

BACKGROUND ART

An existing CVD SiC material is densely formed with large and small crystal grains of 3 µm to 15 µm and an average crystal grain size of 7 µm to 8 µm, thus forming few grain boundaries. Therefore, the thermal conductivity due to the crystal grains is predominant, indicating a high value of thermal conductivity. The high thermal conductivity of such a CVD SiC material is advantageous for heat emission to minimize damage to semiconductor equipment due to high process temperatures used in some semiconductor etching processes.

It is required to form a uniform temperature of the wafer since uniform etching of a wafer edge is required to increase a semiconductor chip yield in a semiconductor process using low process temperatures such as a large scale integrated circuit (LSI). When using a conventional high thermal conductivity CVD SiC material in such a process, there is a problem of increasing the temperature non-uniformity in the wafer due to heat loss.

DISCLOSURE OF INVENTION

Technical Goals

The present invention is to solve the problems as described above, and relates to a SiC material which adjusts thermal conductivity by refining the average crystal grain size and can be effectively applied to a semiconductor manufacturing process requiring low temperatures, and a method for manufacturing the SiC material.

Problems to be solved by the present invention are not limited to the problems mentioned above, and other problems not mentioned will be clearly understood by one of ordinary skill in the art from the following description.

Technical Solutions

According to an embodiment of the present invention, it relates to a SiC material including a low thermal conductivity region which has an average crystal grain size of 3.5 µm or less, and is a (111) plane preferential growth in X-ray diffraction analysis.

According to an embodiment of the present invention, the low thermal conductivity region may have an average crystal grain size of 0.5 µm to 3.5 µm.

According to an embodiment of the present invention, the low thermal conductivity region may have a diffraction intensity ratio (I) of the X-ray diffraction analysis calculated according to Equation 1 below of 0.5 or less.

Diffraction intensity ratio $(I)$=(peak intensity of (200) plane+peak intensity of (220) plane+peak intensity of (311) plane)/peak intensity of (111) plane  [Equation 1]

According to an embodiment of the present invention, the low thermal conductivity region may have a diffraction intensity ratio (I) of the X-ray diffraction analysis calculated according to Equation 2 below of 0.5 or less.

Diffraction intensity ratio $(I)$=(peak intensity of (200) plane+peak intensity of (220) plane)/peak intensity of (111) plane  [Equation 2]

According to an embodiment of the present invention, the diffraction intensity ratio (I) may be 0.001 to 0.3.

According to an embodiment of the present invention, the low thermal conductivity region may have a thermal conductivity of 200 W/mk or less.

According to an embodiment of the present invention, the low thermal conductivity region may be deposited by a CVD method.

According to an embodiment of the present invention, the SiC material may be a material of a part used in a plasma processing apparatus for manufacturing a semiconductor non-memory.

According to an embodiment of the present invention, the SiC material may be a ring for mounting a wafer, and the low thermal conductivity region may be formed in a region where the wafer is mounted.

According to an embodiment of the present invention, the low thermal conductivity region may have a temperature deviation of 1° C. or less.

According to an embodiment of the present invention, the low thermal conductivity region may be formed to 50% or more and less than 100% of the area of the SiC layer.

According to an embodiment of the present invention, the SiC layer may have a thickness of 2 mm or more.

According to an embodiment of the present invention, it relates to a SiC material including a SiC layer which has an average crystal grain size of 3.5 µm or less, and is a (111) plane preferential growth in X-ray diffraction analysis.

According to an embodiment of the present invention, the SiC layer may have a thermal conductivity of 200 W/mk or less.

According to an embodiment of the present invention, the SiC layer may have a diffraction intensity ratio (I) of the X-ray diffraction analysis calculated according to Equation 1 below of 0.5 or less.

$$\text{Diffraction intensity ratio }(I) = \frac{(\text{peak intensity of }(200)\text{ plane} + \text{peak intensity of }(220)\text{ plane} + \text{peak intensity of }(311)\text{ plane})}{\text{peak intensity of }(111)\text{ plane}} \quad [\text{Equation 1}]$$

According to an embodiment of the present invention, the SiC layer may have a diffraction intensity ratio (I) of the X-ray diffraction analysis calculated according to Equation 2 below of 0.5 or less.

$$\text{Diffraction intensity ratio }(I) = \quad [\text{Equation 2}]$$

-continued (peak intensity of (200) plane + peak intensity of (220) plane)/peak intensity of (111) plane According to an embodiment of the present invention, the SiC layer may have a thickness of 2 mm or more.

According to an embodiment of the present invention, it relates to a method for manufacturing a SiC material, the method including the steps of: preparing a substrate; and forming a SiC layer on the substrate using a CVD method, in which the SiC layer has a low thermal conductivity region formed in at least a portion thereof, the low thermal conductivity region which has an average crystal grain size of 3.5 μm or less, and is a (111) plane preferential growth in X-ray diffraction analysis.

Effects

The present invention may provide a CVD SiC material which exhibits low thermal conductivity properties compared to a conventional CVD SiC material by adjusting the average crystal grain size.

The present invention may provide a CVD SiC material applicable to a semiconductor process requiring low process temperatures in an economical manner since thermal conductivity may be adjusted in a simple manner according to changes in process conditions.

Since a uniform temperature distribution may be formed in the wafer in a microprocess semiconductor manufacturing process such as LSI, the present invention may achieve uniform etching to the wafer edge, and may improve wafer yield and quality.

BEST MODE FOR CARRYING OUT THE INVENTION

Figure 1A:
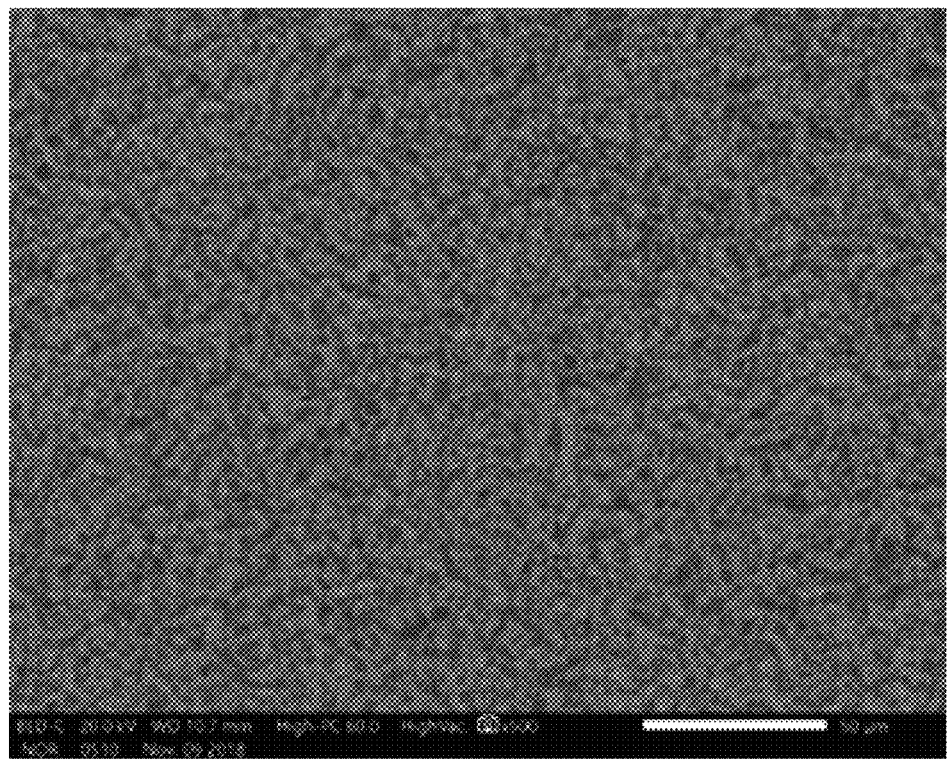
FIG. 1A shows an SEM image of the SiC material manufactured in Exemplary Embodiment 2 of the present invention.

Hereinafter, embodiments will be described in detail with reference to the accompanying drawings. However, since various changes may be applied to the embodiments, the scope of rights of the patent application is not restricted or limited by such embodiments. It should be understood that all modifications, equivalents and substitutes for the embodiments are included within the scope of the rights.

Terms used in the embodiments have been used for the purpose of explanation only, and the terms should not be interpreted as an intention of limiting the explanation. An expression of the singular number includes an expression of the plural number unless clearly defined otherwise in the context. In the present specification, it should be understood that a term such as "comprises" or "having" is used to specify existence of a feature, a number, a step, an operation, an element, a part, or a combination thereof described in the specification, but it does not preclude the possibility of the existence or addition of one or more other features, numbers, steps, operations, elements, parts, or combinations thereof.

Unless otherwise defined, all terms, including technical or scientific terms, used herein have the same meaning as those commonly understood by one of ordinary skill in the art to which embodiments pertain. Terms, such as those defined in commonly used dictionaries, should be interpreted as having meanings that are consistent with those in the context of the related art but are not interpreted as having ideal or excessively formal meanings unless clearly defined in the present application.

Further, in the description with reference to the accompanying drawings, the same elements are assigned the same reference numerals regardless of the reference numerals, and the overlapping description thereof will be omitted. In the description of the embodiments, if it is determined that a detailed description of a related known technology may unnecessarily obscure the gist of the embodiments, the detailed description thereof will be omitted.

The present invention relates to a SiC material, and according to an embodiment of the present invention, the SiC material may include a SiC layer having a low thermal conductivity region formed in at least a portion thereof. The SiC layer may provide a region having a uniform temperature distribution by forming the low thermal conductivity region. The low thermal conductivity region may be formed to 50% or more and less than 100% of an area of the SiC layer.

The low thermal conductivity region may be formed by adjusting the average crystal grain size in the SiC layer. For example, it is possible to finely adjust the average crystal grain size and lower the thermal conductivity by adjusting the growth rate through process changes such as process temperature, raw material supply rate, etc. in the deposition process by the CVD method. That is, the average crystal grain size of the low thermal conductivity region is reduced to increase the formation of grain boundaries so that a structure that suppresses heat transfer may be formed, and low thermal conductivity may be exhibited.

The average crystal grain size of the low thermal conductivity region may have a lower size than an average crystal grain size or a maximum crystal grain size of the entire SiC layer. For example, the low thermal conductivity region may have an average crystal grain size of: 3.5 μm or less; 0.01 μm to 3.5 μm; 0.1 μm to 3.5 μm; or 0.5 μm to 3.5 μm. When the low thermal conductivity region is included within the range of the average crystal grain size, low thermal conductivity may be formed, and a uniform temperature distribution may be formed in the low thermal conductivity region. The crystal grain size may mean an area, a length, a particle size, a diameter, etc. of a crystal grain.

The low thermal conductivity region is a (111) plane preferential growth in X-ray diffraction analysis, and may form a low thermal conductivity region which may improve stability and lifespan of the SiC material in a plasma environment or the like according to the (111) plane preferential growth. That is, a relatively high (111) plane preferential growth compared to a region except for the low thermal conductivity region in the SiC layer may be achieved.

For example, a diffraction intensity ratio (I) of X-ray diffraction analysis according to Equation 1 and/or Equation 2 below may be represented. The diffraction intensity ratio (I) of the ray diffraction analysis may be: 0.5 or less; 0.001 to 0.3 or less; 0.01 to 0.3; or 0.1 to 0.2.

$$\text{Diffraction intensity ratio } (I) = \qquad \text{[Equation 1]}$$
$$(\text{peak intensity of (200) plane} + \text{peak intensity of}$$
$$(220) \text{ plane} + \text{peak intensity of (311) plane})/$$
$$\text{peak intensity of (111) plane}$$

$$\text{Diffraction intensity ratio } (I) = \qquad \text{[Equation 2]}$$
$$(\text{peak intensity of (200) plane} + \text{peak intensity of}$$
$$(220) \text{ plane})/\text{peak intensity of (111) plane}$$

The low thermal conductivity region may have a thermal conductivity lower than a maximum thermal conductivity or an average thermal conductivity of the entire SiC layer, and may have a thermal conductivity of, for example, 200 W/mk or less; 20 W/mk to 200 W/mk; or 80 to 200 W/mk. The low thermal conductivity region may have a temperature deviation of: 1° C. or less; 0.8° C. or less; or 0.5° C. or less. When the low thermal conductivity region is included within the thermal conductivity and temperature deviation ranges, a uniform temperature distribution may be exhibited, and product quality, yield, etc. may be improved in the semiconductor manufacturing process.

The SiC layer may be formed to a thickness of: 2 mm or more; 10 mm or more; or 50 mm or more, and may have a single layer or multiple layers deposited therein by the CVD method. When forming the multiple layers, layers of the same or different configurations may be formed, and components and thicknesses of the multiple layers, average crystal grain sizes and thermal conductivities of the low thermal conductivity regions, growth directions of the crystal planes, etc. may be the same or different. At this time, when the low thermal conductivity region is formed in the SiC layer forming the multiple layers, the effect of blurring the clear boundary between the layers may be expected by reducing the resistance deviation and making the structure uniform.

The SiC material is a material of a part used in a plasma processing apparatus for semiconductor manufacturing, and may be, for example, a ring for mounting a wafer for mounting the wafer applied to a non-memory manufacturing process that requires low process temperatures, that is, an LSI semiconductor manufacturing process. In the SiC material, a low thermal conductivity region may be formed in a portion requiring the formation of a uniform temperature distribution, and a low thermal conductivity region may be formed in a region which is in direct contact with the wafer in the ring for mounting the wafer. Since this forms a uniform temperature distribution over the entire wafer in the LSI semiconductor manufacturing process, uniform etching to the wafer edge is possible, and yield and quality of the semiconductor chip may be improved.

According to an embodiment of the present invention, it relates to a SiC material including a SiC layer having low thermal conductivity properties.

The SiC layer may have an average crystal grain size of: 3.5 μm or less; 0.01 μm to 3.5 μm; 0.1 μm to 3.5 μm; or 0.5 μm to 3.5 μm. When the SiC layer is included within the range of the average crystal grain size, low thermal conductivity may be formed, and a uniform temperature distribution may be formed.

The SiC layer may have a thermal conductivity of: 200 W/mk or less; 20 W/mk to 200 W/mk; or 80 to 200 W/mk. Alternatively, the SiC layer may have a temperature deviation of: 1° C. or less; 0.8° C. or less; or 0.5° C. or less. When the SiC layer is included within the thermal conductivity and temperature deviation ranges, a uniform temperature distribution may be exhibited, and product quality, yield, etc. may be improved in the semiconductor manufacturing process.

The SiC layer is a (111) plane preferential growth in X-ray diffraction analysis, and may provide a stable low thermal conductivity material in a plasma environment according to the (111) plane preferential growth. For example, a diffraction intensity ratio (I) of X-ray diffraction analysis according to Equation 1 and/or Equation 2 below may be represented. The diffraction intensity ratio (I) of the X-ray diffraction analysis may be: 0.5 or less; 0.001 to 0.3 or less; 0.01 to 0.3; or 0.1 to 0.2.

$$\text{Diffraction intensity ratio } (I) = \qquad \text{[Equation 1]}$$
$$(\text{peak intensity of (200) plane} + \text{peak intensity of}$$
$$(220) \text{ plane} + \text{peak intensity of (311) plane})/$$
$$\text{peak intensity of (111) plane}$$

$$\text{Diffraction intensity ratio } (I) = \qquad \text{[Equation 2]}$$
$$(\text{peak intensity of (200) plane} + \text{peak intensity of}$$
$$(220) \text{ plane})/\text{peak intensity of (111) plane}$$

The SiC layer may be formed to a thickness of: 2 mm or more; 10 mm or more; or 50 mm or more, and may have a single layer or multiple layers deposited therein by the CVD method. When forming the multiple layers, the same or different layers may be formed, and components and thicknesses of the layers, average crystal grain sizes and thermal conductivities of the low thermal conductivity regions, growth directions of the crystal planes, etc. may be the same or different. At this time, when the low thermal conductivity region is formed in the SiC layer forming the multiple layers, the effect of blurring the clear boundary between the layers may be expected by reducing the resistance deviation and making the structure uniform.

The present invention provides a method for manufacturing a SiC material according to the present invention, and the method according to an embodiment of the present invention may include the steps of: preparing a substrate; and forming a SiC layer on the substrate by using the CVD method.

The step of preparing the substrate may be applied without limitation as long as it is applicable to the manufacturing of the SiC layer or the SiC material.

In the step of forming the SiC layer on the substrate by using the CVD method, the entire SiC layer may have low thermal conductivity properties, or a low thermal conductivity region may be formed in at least a portion of the SiC layer. That is, the thermal conductivity may be lowered by adjusting CVD method deposition process conditions, for example, process temperature, raw material supply flow rate, etc., thereby finely adjusting the average crystal grain size through control of the growth rate, and increasing the grain boundary (for example, 30% or more).

The process temperature may be appropriately selected in order to adjust the average crystal grain size, and may be, for example, a temperature lower than the deposition temperature of the SiC layer by a conventional CVD method or a temperature lower than the maximum or average process temperature of the step of forming the SiC layer. The raw material supply flow rate may be appropriately selected in order to adjust the average crystal grain size, and for example, may be: 90% or less; 60% or less; or 50% or less of the supply flow rate applied during deposition of the SiC layer by the conventional CVD method or the maximum or average supply flow rate of the step of forming the SiC layer.

The step of forming the SiC layer on the substrate by using the CVD method may be a growth rate lower than the growth rate applied during deposition of the SiC layer by the conventional CVD method, or a growth rate lower than the maximum or average growth rate of the step of forming the SiC layer.

Exemplary Embodiment 1

A SiC layer (2 mm thick) was deposited on a substrate by the CVD method to manufacture a CVD SiC material with a SiC layer formed therein having a crystal grain size of 0.5 μm to 3 μm (average crystal grain size: 0.82 μm, ASTM E112 measurement method applied).

Exemplary Embodiment 2

A SiC layer (2 mm thick) was deposited on a substrate by the CVD method to manufacture a CVD SiC material with a SiC layer formed therein having a crystal grain size of 0.5 μm to 3 μm (average crystal grain size: 2.2 μm, ASTM E112 measurement method applied).

Comparative Embodiment 1

A SiC layer (2 mm thick) was deposited on a substrate by the CVD method to manufacture a CVD SiC material with a SiC layer formed therein having a crystal grain size of 3 μm to 15 μm (average crystal grain size: 7.4 μm, ASTM E112 measurement method applied).

Comparative Embodiment 2

A SiC layer (2 mm thick) was deposited on a substrate by the CVD method to manufacture a CVD SiC material with a SiC layer formed therein having a crystal grain size of 3 μm to 15 μm (average crystal grain size: 9.07 μm, ASTM E112 measurement method applied).

Evaluation Embodiment 1

Figure 1B:
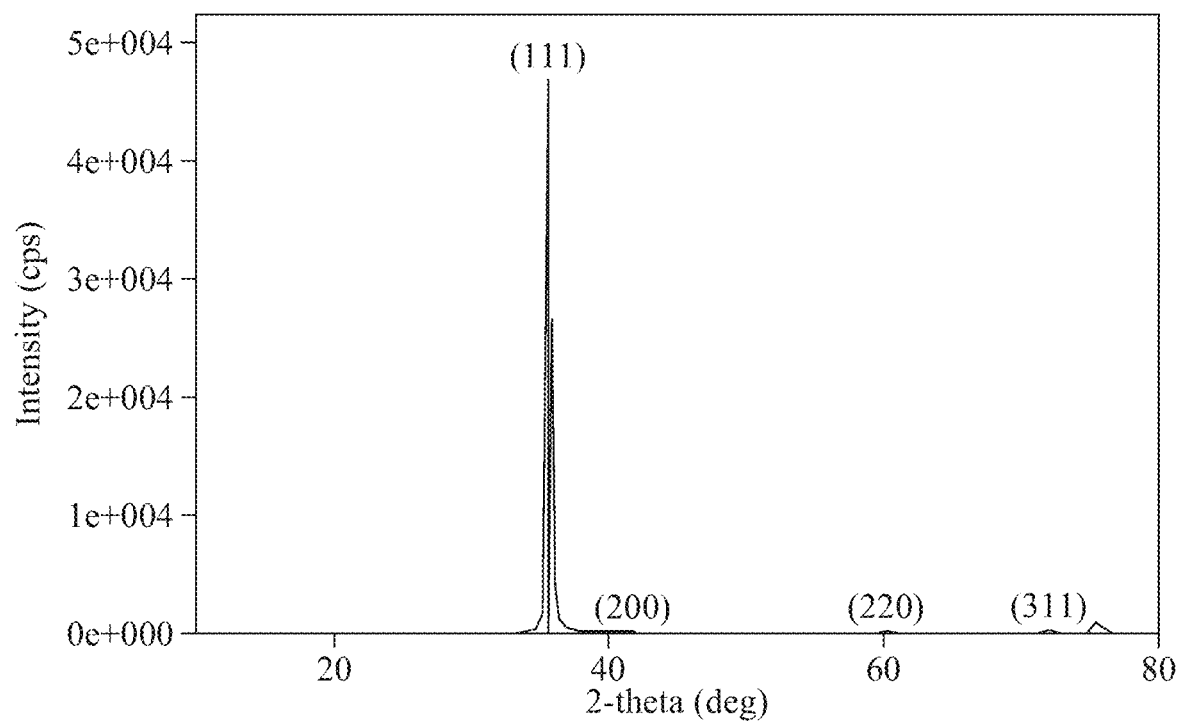
FIG. 1B shows XRD pattern analysis results of the SiC material manufactured in Exemplary Embodiment 2 of the present invention.
Figure 2A:
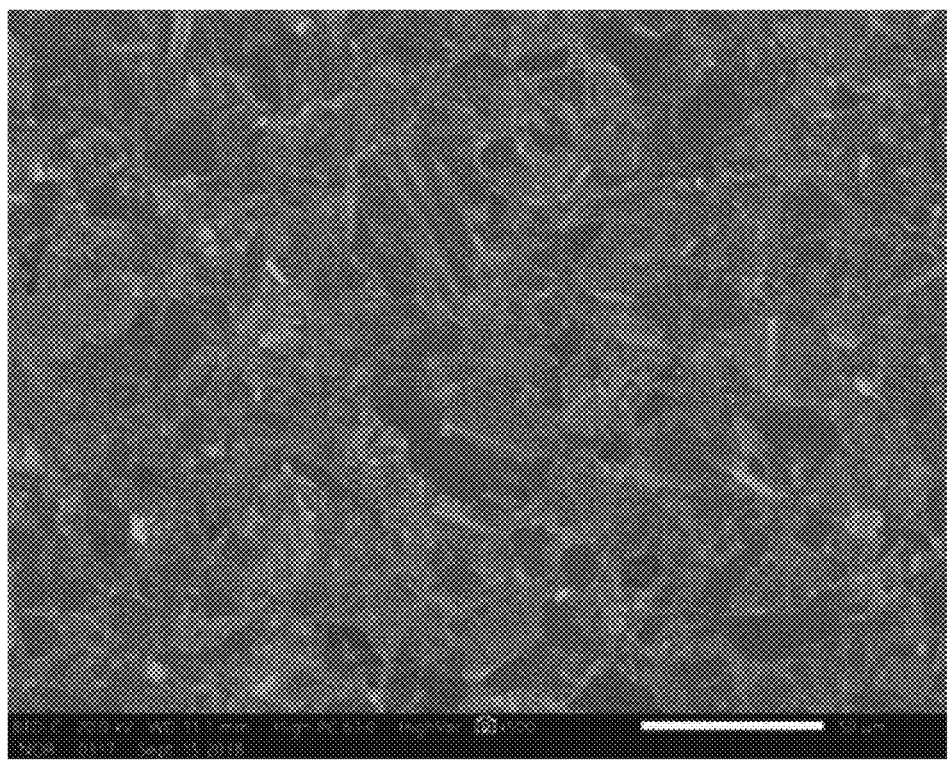
FIG. 2A shows an SEM image of the SiC material manufactured in Comparative Embodiment 1 of the present invention.
Figure 2B:
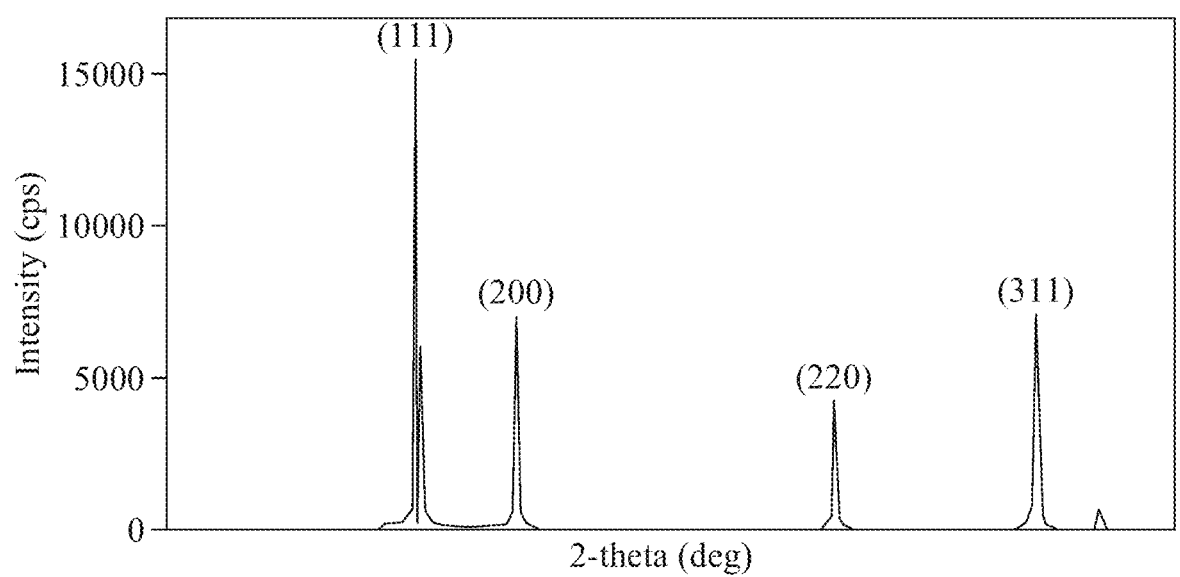
FIG. 2B shows XRD pattern analysis results of the SiC material manufactured in Comparative Embodiment 1 of the present invention.

After measuring SEM and XRD of the CVD SiC materials of Exemplary Embodiment 2 and Comparative Embodiment 1, the measured SEM and XRD are shown in FIG. 1 (FIGS. 1(A) and 1(B), Exemplary Embodiment 2) and FIG. 2 (FIGS. 2(A) and 2(B), Comparative Embodiment 1).

The XRD was measured in a measurement range of 10 to 80°, at a scan speed of 10, and at a scan step of 0.05 by using "Rigaku DMAX200" equipment. Looking at FIG. 1, it can be confirmed that the CVD SiC material of Exemplary Embodiment 2 has a crystal grain size range of 0.5 μm to 3 μm, and the (111) plane is preferentially grown so that the diffraction intensity ratio (I) according to Equation 1 is 0.01.

Meanwhile, since the CVD SiC material of Comparative Embodiment 1 is a commonly used material, has a crystal grain size of 3 to 15 μm (average 7.4 μm), and the (111) plane is preferentially grown, but peak intensities of (200), (220), and (311) planes are 5,000 cps or more, it can be confirmed that the CVD SiC material is out of the range of the diffraction intensity ratio (I) according to Equation 1 of the present invention.

Evaluation Embodiment 2

Figure 3:
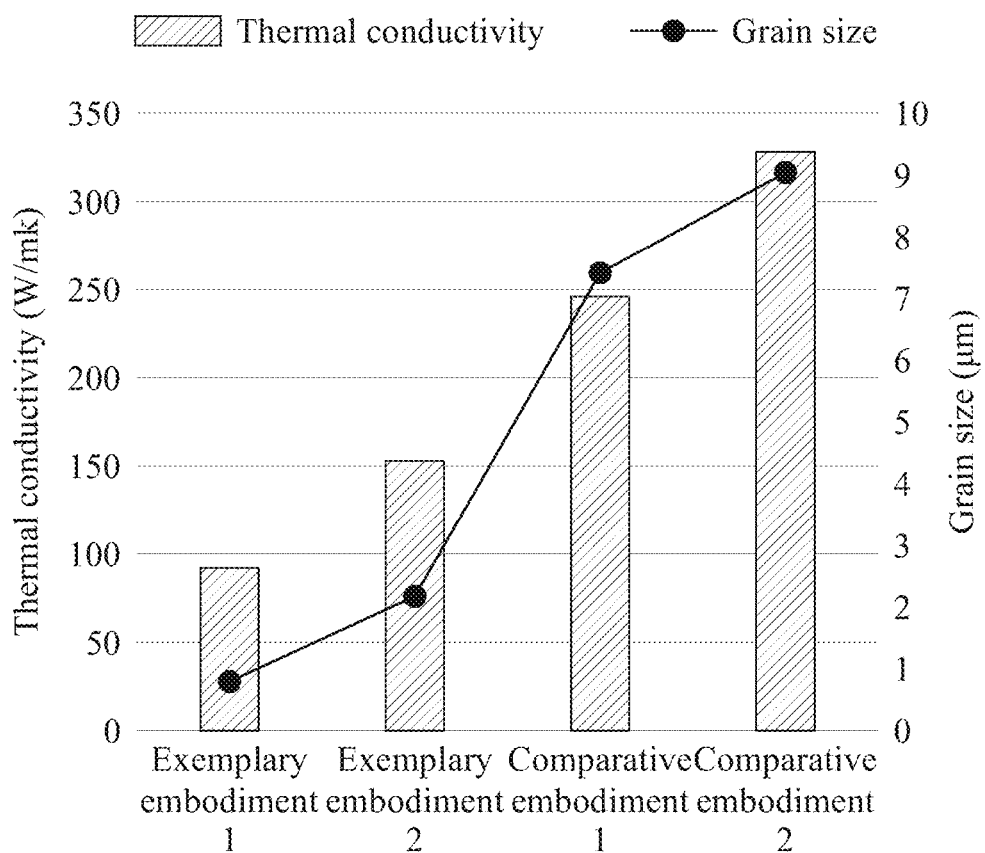
FIG. 3 shows measurement results of average crystal grain sizes and thermal conductivities of the SiC materials manufactured in Exemplary Embodiments and Comparative Embodiments of the present invention.

After measuring thermal conductivities of the CVD SiC materials manufactured in Exemplary Embodiments and Comparative Embodiments, the measured thermal conductivities thereof are shown in FIG. 3 and Table 1. The crystal grain sizes of the CVD SiC materials were measured by the ASTM E122 method. The thermal conductivities were measured by preparing specimens based on the KS standard using sorting equipment having a model name of Light Flash Apparatus (LFA) 447 NanoFlash manufactured by NETZSCH company.

Looking at FIG. 3, it can be confirmed that the thermal conductivities are increased according to the increase of the crystal grain sizes by exhibiting low thermal conductivity properties when the average crystal grain size is 2.2 μm or less, thermal conductivities exceeding 200 W/mK when the average crystal grain size is 5 μm or more, and thermal conductivities exceeding 300 W/mK when the average crystal grain size is 8 μm or more.

TABLE 1

| | Exemplary Embodiment 1 | Exemplary Embodiment 2 | Comparative Embodiment 1 | Comparative Embodiment 2 |
|---|---|---|---|---|
| Thermal conductivity (W/mK) | 94 | 153 | 247 | 329 |
| Average crystal grain size (μm) | 0.82 | 2.2 | 7.4 | 9.07 |

The present invention may provide a CVD SiC material which is refined to an average crystal grain size of 3 μm or less by reducing the growth rate compared to Comparative Embodiments through a process change in the CVD deposition process, and which has a low thermal conductivity of 80 W/mK to 200 W/mK by inducing a (111) preferential growth. Although the embodiments have been described with reference to the limited drawings as described above, one of ordinary skill in the art may apply various technical modifications and variations based on the aforementioned descriptions. For example, appropriate results can be achieved although described techniques are performed in order different from a described method, and/or described elements are joined or combined in a form different from the described method, or replaced or substituted by other elements or equivalents.

Therefore, other implementations, other embodiments, and equivalents to the patent claim scope also belong to the scope of the claims described later.

The invention claimed is:

1. A SiC material comprising a SiC layer including a low thermal conductivity region which has an average crystal grain size of 3.5 μm or less, and is a (111) plane preferential growth in X-ray diffraction analysis,
    wherein the low thermal conductivity region has a (111) plane, a (200) plane, a (220) plane, and a (311) plane in X-ray diffraction analysis,
    wherein the SiC layer has a thickness of 2 mm or more,
    wherein the low thermal conductivity region has a thermal conductivity of 200 W/m·k or less, and wherein the low thermal conductivity region has a diffraction intensity ratio (I) of the X-ray diffraction analysis calculated according to Equation 1 below of 0.5 or less;

$$\text{Diffraction intensity ratio }(I) = \text{[Equation 1]}$$
$$(\text{peak intensity of (200) plane} + \text{peak intensity of}$$
$$(220) \text{ plane} + \text{peak intensity of (311) plane})/$$
$$\text{peak intensity of (111) plane.}$$

2. The SiC material of claim 1, wherein the low thermal conductivity region has the average crystal grain size of 0.5 µm to 3.5 µm.

3. The SiC material of claim 1, wherein the low thermal conductivity region has a diffraction intensity ratio (I) of the X-ray diffraction analysis calculated according to Equation 2 below of 0.5 or less;

$$\text{Diffraction intensity ratio }(I) = \text{[Equation 2]}$$
$$(\text{peak intensity of (200) plane} + \text{peak intensity of}$$
$$(220) \text{ plane})/\text{peak intensity of (111) plane.}$$

4. The SiC material of claim 3, wherein the diffraction intensity ratio (I) is 0.001 to 0.3.

5. The SiC material of claim 1, wherein the diffraction intensity ratio (I) is 0.001 to 0.3.

6. The SiC material of claim 1, wherein the low thermal conductivity region is deposited by a CVD method.

7. The SiC material of claim 1, wherein the SiC material is a material of a part used in a plasma processing apparatus for manufacturing a semiconductor non-memory.

8. The SiC material of claim 1, wherein the SiC material is a ring for mounting a wafer, and the low thermal conductivity region is formed in a region where the wafer is mounted.

9. The SiC material of claim 1, wherein the low thermal conductivity region has a temperature deviation of 1° C. or less.

10. The SiC material of claim 1, wherein the low thermal conductivity region is formed to 50% or more and less than 100% of an area of the SiC layer.

11. An SiC material comprising an SiC layer which has an average crystal grain size of 3.5 µm or less, and is a (111) plane preferential growth in X-ray diffraction analysis,
wherein the SiC layer has a (111) plane, a (200) plane, a (220) plane, and a (311) plane in X-ray diffraction analysis,
wherein the SiC layer has a thickness of 2 mm or more,
wherein the SiC layer has a thermal conductivity of 200 W/m·k or less,
wherein the SiC layer has a diffraction intensity ratio (I) of the X-ray diffraction analysis calculated according to Equation 1 below of 0.5 or less;

$$\text{Diffraction intensity ratio }(I) = \text{[Equation 1]}$$
$$(\text{peak intensity of (200) plane} + \text{peak intensity of}$$
$$(220) \text{ plane} + \text{peak intensity of (311) plane})/$$
$$\text{peak intensity of (111) plane.}$$

12. The SiC material of claim 11, wherein the SiC layer has a diffraction intensity ratio (I) of the X-ray diffraction analysis calculated according to Equation 2 below of 0.5 or less;

$$\text{Diffraction intensity ratio }(I) = \text{[Equation 2]}$$
$$(\text{peak intensity of (200) plane} + \text{peak intensity of}$$
$$(220) \text{ plane})/\text{peak intensity of (111) plane.}$$

13. A method for manufacturing a SiC material, the method comprising steps of:
preparing a substrate; and
forming a SiC layer on the substrate using a CVD method, wherein the SiC layer has a low thermal conductivity region formed in at least a portion thereof, the low thermal conductivity region which has an average crystal grain size of 3.5 µm or less, and is a (111) plane preferential growth in X-ray diffraction analysis,
wherein the low thermal conductivity region has a (111) plane, a (200) plane, a (220) plane and a (311) plane in X-ray diffraction analysis,
wherein the SiC layer has a thickness of 2 mm or more,
wherein the low thermal conductivity region has a thermal conductivity of 200 W/m·k or less,
wherein the low thermal conductivity region has a diffraction intensity ratio (I) of the X-ray diffraction analysis calculated according to Equation 1 below of 0.5 or less;

$$\text{Diffraction intensity ratio }(I) = \text{[Equation 1]}$$
$$(\text{peak intensity of (200) plane} + \text{peak intensity of}$$
$$(220) \text{ plane} + \text{peak intensity of (311) plane})/$$
$$\text{peak intensity of (111) plane.}$$

* * * * *